(12) United States Patent
Fuchi et al.

(10) Patent No.: US 8,405,111 B2
(45) Date of Patent: Mar. 26, 2013

(54) SEMICONDUCTOR LIGHT-EMITTING DEVICE WITH SEALING MATERIAL INCLUDING A PHOSPHOR

(75) Inventors: Shingo Fuchi, Aichi (JP); Yoshikazu Takeda, Tokyo (JP); Ayako Sakano, Aichi (JP); Ryota Mizutani, Aichi (JP)

(73) Assignee: National University Corporation Nagoya University, Nagoya-Shi, Aichi (JP)

(*) Notice: Subject to any disclaimer, the term of this patent is extended or adjusted under 35 U.S.C. 154(b) by 0 days.

(21) Appl. No.: 13/129,384

(22) PCT Filed: Nov. 10, 2009

(86) PCT No.: PCT/JP2009/069129
§ 371 (c)(1),
(2), (4) Date: Jul. 11, 2011

(87) PCT Pub. No.: WO2010/055831
PCT Pub. Date: May 20, 2010

(65) Prior Publication Data
US 2011/0260194 A1    Oct. 27, 2011

(30) Foreign Application Priority Data
Nov. 13, 2008  (JP) .................. 2008-290723

(51) Int. Cl.
H01L 29/22    (2006.01)
H01L 29/227   (2006.01)
H01L 33/00    (2010.01)
H01L 29/24    (2006.01)
(52) U.S. Cl. .......... 257/98; 257/100; 257/E33.059; 257/E33.061; 257/E33.073

(58) Field of Classification Search ............ 257/98, 257/100, E33.059, E33.061, E33.073
See application file for complete search history.

(56) References Cited

U.S. PATENT DOCUMENTS

| 4,068,129 A * | 1/1978 | Rabatin ............... 250/483.1 |
| 5,813,753 A * | 9/1998 | Vriens et al. ............ 362/293 |
| 6,340,824 B1 | 1/2002 | Komoto et al. ........... 257/99 |

(Continued)

FOREIGN PATENT DOCUMENTS

JP  2006-287113 A   10/1919
JP  61-96780 A       5/1986

(Continued)

OTHER PUBLICATIONS

A. Vecht et al., ARO-ERO Phosphors for Marking, Coding and Information Storage 4th & Final Report, DAAD19-02-1-0453, R+D 9350 EE1, Feb. 3, 2004, pp. 1-15 and Figs 1, 2 and 3.

(Continued)

*Primary Examiner* — Ida M Soward
(74) *Attorney, Agent, or Firm* — McGinn IP Law Group, PLLC

(57) ABSTRACT

A semiconductor light-emitting device includes a semiconductor light-emitting element, and a sealing material sealing the semiconductor light-emitting element. The sealing material includes a phosphor which includes a matrix including a glass and a luminescence center included in the matrix. A refractive index of the matrix is more in a far side of the matrix than the refractive index of the matrix in a near side of the matrix, the far side being located farther from the semiconductor light-emitting element than the near side. The refractive index of the matrix is the same as a refractive index of the semiconductor light-emitting element.

20 Claims, 11 Drawing Sheets

U.S. PATENT DOCUMENTS

| | | | |
|---|---|---|---|
| 6,509,651 B1 | 1/2003 | Matsubara et al. | 257/461 |
| 6,576,488 B2 * | 6/2003 | Collins et al. | 438/29 |
| 6,614,179 B1 * | 9/2003 | Shimizu et al. | 313/512 |
| 6,686,676 B2 * | 2/2004 | McNulty et al. | 313/112 |
| 7,138,660 B2 * | 11/2006 | Ota et al. | 257/79 |
| 7,297,293 B2 * | 11/2007 | Tamaki et al. | 252/301.4 F |
| 7,479,662 B2 * | 1/2009 | Soules et al. | 257/98 |
| 7,858,997 B2 * | 12/2010 | Yoshimura et al. | 257/98 |
| 7,872,410 B2 * | 1/2011 | Tasumi et al. | 313/503 |
| 7,939,843 B2 * | 5/2011 | Haruna et al. | 257/98 |
| 2002/0079506 A1 | 6/2002 | Komoto et al. | 257/99 |
| 2002/0088985 A1 | 7/2002 | Komoto et al. | 257/99 |
| 2004/0012027 A1 * | 1/2004 | Keller et al. | 257/79 |
| 2006/0068154 A1 * | 3/2006 | Parce et al. | 428/76 |
| 2006/0082679 A1 | 4/2006 | Chua et al. | 348/371 |
| 2006/0082995 A1 | 4/2006 | Chua et al. | 362/231 |
| 2007/0047253 A1 * | 3/2007 | Lee et al. | 362/561 |
| 2007/0182323 A1 | 8/2007 | Ogata et al. | 313/512 |
| 2007/0273282 A1 * | 11/2007 | Radkov et al. | 313/512 |
| 2008/0090947 A1 * | 4/2008 | Shin et al. | 524/131 |
| 2008/0106186 A1 * | 5/2008 | Ishii et al. | 313/503 |
| 2008/0149957 A1 * | 6/2008 | Kameshima et al. | 257/98 |
| 2008/0231170 A1 * | 9/2008 | Masato et al. | 313/501 |
| 2008/0283860 A1 * | 11/2008 | Suehiro et al. | 257/98 |
| 2009/0091045 A1 * | 4/2009 | Tanikawa et al. | 257/791 |
| 2009/0321758 A1 * | 12/2009 | Liu et al. | 257/98 |
| 2010/0194263 A1 * | 8/2010 | Winkler et al. | 313/486 |
| 2010/0200874 A1 * | 8/2010 | Shioi et al. | 257/91 |
| 2012/0194066 A1 * | 8/2012 | Nakamura et al. | 313/506 |
| 2012/0241779 A1 * | 9/2012 | Reeh et al. | 257/89 |

FOREIGN PATENT DOCUMENTS

| | | |
|---|---|---|
| JP | 11-87778 A | 3/1999 |
| JP | 2000-150961 A | 5/2000 |
| JP | 2001-214162 A | 8/2001 |
| JP | 2003-243724 A | 8/2003 |
| JP | 2006-114911 A | 4/2006 |
| JP | 2006-193399 A | 7/2006 |
| JP | 2007-210870 A | 8/2007 |
| JP | 2008-034546 A | 2/2008 |
| JP | 2008-506246 A | 2/2008 |
| JP | 2008-153553 A | 7/2008 |
| JP | 2008-185378 A | 8/2008 |
| WO | WO 2006/006544 A1 | 1/2006 |

OTHER PUBLICATIONS

Shingo Fuchi et al., "Wideband Infrared Emission From $Yb^{3+}$- and $Nd^{3+}$-Doped $Bi_2O_3$—$B_2O_3$ Glass Phosphor for an Optical Coherence Tomography Light Source", Japanese Journal of Applied Physics, vol. 47, No. 10, Oct. 17, 2008, pp. 7932-7935.

* cited by examiner (a)

(b)

(a)

(b)

SEMICONDUCTOR LIGHT-EMITTING DEVICE WITH SEALING MATERIAL INCLUDING A PHOSPHOR

TECHNICAL FIELD

This invention relates to a semiconductor light-emitting device.

BACKGROUND ART

Conventionally, as a semiconductor light-emitting device which uses a semiconductor light-emitting element such as an LED element etc., it is general that a sealing material such as a transparent resin, a glass etc. seals a semiconductor light-emitting element (for example, see the patent literatures 1 and 2). As this type of the semiconductor light-emitting device, it is known that phosphor particles are contained in the transparent resin and light from the semiconductor light-emitting element is converted by the phosphor particles.

Also, it is suggested that a light source for optical coherence tomography comprises an infrared glass phosphor and a semiconductor light-emitting element (for example, see the patent literature 3). The patent literature 3 has a description "a combination of an infrared glass phosphor and a semiconductor light-emitting element is like a white LED" at paragraph [0011]. Thus, the light source for optical coherence tomography described in the patent literature 3 is a similar constitution to an existing heretofore known white LED and is understood that the infrared glass phosphor is contained in a sealing material as particles.

PATENT LITERATURE 1: Japanese Patent Laid-open Publication No. 2008-34546
PATENT LITERATURE 2: Japanese Patent Laid-open Publication No. 2006-114911
PATENT LITERATURE 3: Japanese Patent Laid-open Publication No. 2008-185378

DISCLOSURE OF INVENTION

Technical Problem

However, when the phosphor particles are contained in the sealing material, because the sealing material and the phosphor particles have different specific gravities, it is difficult to disperse the phosphor particles uniformly into the sealing material. Thus, there is a problem that a light from the sealing material has color unevenness.

Also, there is a problem that a production cost is expensive because preparing phosphor powders, controlling a size of the phosphor powders, mixing the phosphor powders and the sealing material etc. are necessary when producing the device.

This invention is invented considering the above circumstances, a purpose of this invention is to provide a semiconductor light-emitting device which does not suffer from color unevenness of light taken out of a sealing material even when a phosphor is used therein and enables reduction of the production cost.

Technical Solution

In order to achieve the above purpose, a semiconductor light-emitting device comprising; a semiconductor light-emitting element; and a sealing material sealing the semiconductor light-emitting element consists only of a phosphor which has a matrix composed of a glass and a luminescence center contained in the matrix is provided by this invention.

In the above semiconductor light-emitting device, the luminescence center of the phosphor may be at least one of rare-earth ions.

In the above semiconductor light-emitting device, the luminescence center of the phosphor may be at least one of Yb ion and Nd ion.

In the above semiconductor light-emitting device, the phosphor may emit infrared light when excited by light from the semiconductor light-emitting element.

In the above semiconductor light-emitting device, the matrix of the phosphor may be $Bi_2O_3$—$B_2O_3$ based glass.

In the above semiconductor light-emitting device, the semiconductor light-emitting element emits white light.

Advantageous Effects

According to the semiconductor light-emitting device of this invention, color unevenness of light from the device can be reduced because the phosphor seals the semiconductor light-emitting element.

Also, by sealing by the phosphor directly, because any sealing material other than the phosphor becomes unnecessary and mixing the phosphor and the sealing material is unnecessary, the device can be made easily and the production cost can be reduced.

BEST MODE FOR CARRYING OUT INVENTION

FIG. 1 and FIG. 2 show a first embodiment of this invention and FIG. 1 is a typical cross-sectional drawing of a semiconductor light-emitting device.

As shown in FIG. 1, a semiconductor light-emitting device 1 comprises a pair of lead frames 2,3, an LED elements 4 mounted on each lead frame 2,3 and a phosphor 5 sealing the LED element 4 as a sealing material. The semiconductor light-emitting device 1 can emit infrared light of about 850 nm-1100 nm. This wavelength range is suitable for use in a light source of, for example, medical fields, vital observation fields etc. because it has a high penetration depth for biological tissues.

Each lead frame 2,3 consists of a conducting metal and has a rod-like part 21,31 which extends in a predetermined direction and is arranged parallel to one another, a mounting part 22,32 which is formed at the top side of the rod-like part 21,31 and mount the LED element 4, and a reflecting part 23,33 which is formed at the top side of the rod-like part 21,31 and surround the LED element 4. In this document, it is explained the bottom side of each lead frame 2,3 as downward and the top side of these as upward.

Each rod-like part 21,31 is connected to an external power source at the bottom side and the electric power is supplied to the LED element 4. Each mounting part 22,32 extends in direction approaching each other from the top side of the rod-like part 21,31 and is arranged at intervals for ensuring the insulation. An upper surface of each mounting part 22,32 is formed smoothly and has a circular form in an integrated. Each reflecting part 23,33 extends in upper direction from the top side of each rod-like part 21,31 and reflects light from the LED element 4 in upper direction. An inner surface of each reflecting part 23,33 is formed such that it spreads against upside from downside The LED element 4 comprises a substrate 41, a semiconductor layer 42, a p-electrode 43 and an n-electrode 44 which are connected to the semiconductor layer 42. The p-electrode 43 and the n-electrode 44 are connected electrically to each mounting part 22,23. In this embodiment, the LED element 4 is a flip-chip type which the p-electrode 43 and n-electrode 44 are formed on a mounting surface, and is arranged in a manner that strides across each lead frame 2,3 such that the p-electrode 43 is connected to one lead frame 2 and the n-electrode 44 is connected to other lead frame 3.

In this embodiment, the substrate 41 consists of a sapphire, the semiconductor layer 42 consists of a semiconductor expressed in a formula $In_xAl_yGa_{1-x-y}N$ ($0 \leq x \leq 1$, $0 \leq y \leq 1$, $0 \leq x+y \leq 1$) and the LED element 4 emits light, for example, its full width at half maximum is 50 nm and its peak wavelength is 585 nm.

The sealing material which seals the LED element 4 consists only of the phosphor 5 and the inside of the mounting part 22,23 of the lead frame 2,3 and the reflecting part 23,33 is filled with the phosphor 5 whose outer surface is a lenticular surface 51. A film consisting of resin etc. may be formed on the outer surface of the phosphor 5 for protecting the phosphor 5 and controlling light taken out of the sealing material. In this embodiment, the phosphor 5 is flush with the outer side of the lead frame 2,3. The phosphor 5 has a matrix composed of a glass, and a luminescence center contained in this matrix. This "luminescence center" is a structure which exists in a matrix material and emits light, the matrix material means substantially one material and is different from a phosphor contained in a sealing material composed of resin, glass etc. That is, in case that a phosphor is contained in a sealing material composed of resin, glass etc., the sealing material composed of resin, glass etc. and the phosphor are separate materials and do not mean one material. Concretely, the matrix of the phosphor 5 is $Bi_2O_3$—$B_2O_3$ based glass and the luminescence center of the phosphor 5 is Yb ion and Nd ion. The phosphor 5 emits infrared light of 850 nm-1100 nm when excited by light from the LED element 4. After mixing $Yb_2O_3$ powder, $Nd_2O_3$ powder, $Bi_2O_3$ powder and $H_3BO_3$ powder and melting it, the phosphor 5 is made by cooling it. In case of melting it over 1000° C., a reduction action can be suppressed by adding $Sb_2O_3$ powder to it because $Bi^{3+}$ is reduced over 1000° C. When a concentration of $Yb_2O_3$ is equal to or less than 4.0 mol % and a concentration of $Nd_2O_3$ is equal to or less than 5.0 mol %, it is confirmed that the phosphor 5 is melting at 1000° C.

A property of the phosphor 5 of this embodiment is explained in detail referring an excitation spectrum in FIG. 2(a) and an emission spectrum in FIG. 2(b). FIG. 2 shows graphs of an excitation spectrum and an emission spectrum of $Yb_2O_3$ and $Nd_2O_3$ co-doped $Bi_2O_3$—$B_2O_3$ based glass. Concretely, this phosphor 5 is made of $Yb_2O_3$ 1.0 mol %, $Nd_2O_3$ 1.0 mol %, $Bi_2O_3$ 48.5 mol %, $B_2O_3$ 48.5 mol % and $Sb_2O_3$ 1.0 mol %. The excitation spectrum is obtained from an emission intensity measured at 974 nm of emitting wavelength and the emission spectrum is obtained from an emission intensity measured at 530 nm of exciting wavelength.

As shown in FIG. 2(a), this phosphor 5 can be excited from 450 nm to 800 nm. Thus, the LED element 4 can excite the phosphor 5 if it emits light of wavelength range from 450 nm to 800 nm. As shown in FIG. 2(a), the excitation spectrum has plural peaks and excitation efficiencies of around 530 nm, around 585 nm, around 685 nm and around 750 nm is especially excellent. In these peaks, because the excitation efficiency of around 585 nm is most excellent and a peak wavelength of the LED element 4 of this embodiment is 585 nm, it is an excellent excitation efficiency combination of the LED element 4 and the phosphor 5.

As shown in FIG. 2(b), this phosphor 5 has a sharp emission peak at 974 nm and has a relatively broad emission peak at longer side of this emission peak, which has a peak at 1003 nm. A full width at half maximum of the emission peak of 1003 nm is 80 nm.

Next, a method for manufacturing this semiconductor light-emitting device 1 is explained. Firstly, the LED element 4 is mounted on each lead frame 2,3. Each lead frame 2,3 is made by metal working and the LED element 4 is made by epitaxial growth of the semiconductor layer 42 of GaN system on the substrate 41 consisting of a sapphire. Meanwhile, the phosphor 5 in melting condition is made by mixing $Yb_2O_3$ powder, $Nd_2O_3$ powder, $Bi_2O_3$ powder and $H_3BO_3$ powder and melting it. Then, the phosphor 5 is arranged by using a mold at the top of each lead frame 2,3 which mounts the LED element 4 and the phosphor 5 is molded by cooling the phosphor 5. In this way, the semiconductor light-emitting device 1 of cannonball type, whose LED element 4 is sealed by the phosphor 5 having the lenticular surface 51 is completed. Because the LED element 4 is flip-chip mounted, an electric connection part of the LED element 4 and the lead frames 2,3 are difficult to receive physically, thermally etc. damages from the phosphor 5. When molding, it is preferable to mold the phosphor 5 with cooling the LED element 4.

In the semiconductor light-emitting device 1 as consisted above, the LED element 4 emits yellow light which has the peak wavelength of 585 nm and the full width at half maximum of 50 nm when the voltage is impressed to each lead frame 2,3. The phosphor 5 emits infrared light which has the peak wavelength of 1000 nm and the full width at half maximum of 80 nm when excited by yellow light from the LED element 4. Because the LED element 4 is sealed by the phosphor 5 itself and rare-earth ion which is the center of luminescence is uniformly contained in the glass of the matrix, wavelength is uniformly converted in the whole inside of the sealing material consisting only of the phosphor 5. That is, such as an emitting device whose transparent sealing material contains the phosphor particles, color unevenness does not occur according to a distribution state of the particles in the sealing material and light does not reflect at the interface of the phosphor particles and the sealing material. The infrared light converted at the phosphor 5 is focused by the lenticular surface 51 and emitted to outside of the device.

According to the semiconductor light-emitting device 1 of this embodiment, color unevenness of light from the device can be reduced because the phosphor 5 seals the LED element 4 and optics can be controlled because a reflection at the inside of the sealing material (phosphor 5) does not occur. Also, by sealing by the phosphor 5 directly, the device can be made easily and the production cost can be reduced because any sealing material other than the phosphor 5 becomes unnecessary and mixing the phosphor 5 and the sealing material, dispersing the phosphor in the sealing material, etc. are unnecessary.

Furthermore, according to the semiconductor light-emitting device 1 of this embodiment, because a glass is used as the matrix of the phosphor 5, the ligand field of the rare-earth ion as the luminescence center is not homogeneous and a split of 4f core level is not homogeneous, too. In this result, broad emission whose full width at half maximum is relatively broad and emission peaks are continuously connected can be obtained. In contrast, if the matrix is crystal, a split of 4f core level is homogeneous because the ligand field is homogeneous, the broad emission can not be obtained because each emission peaks are sharp. Especially, because of using $Bi_2O_3$—$B_2O_3$ based glass, the melting point of the phosphor 5 is relatively low and the vitrification region is relatively wide, and thus, it has an advantageous in manufacturing the device.

Also, according to the semiconductor light-emitting device 1 of this embodiment, because of containing Yb ion and Nd ion as the luminescence center, the phosphor 5 can emit around 850-1100 nm. Thus, the semiconductor light-emitting device 1 can emit infrared light which is suitable for vital observation.

In the embodiment above, although the luminescence center of the phosphor 5 is $Yb^{3+}$ and $Nd^{3+}$, for example, the luminescence center can be only $Yb^{3+}$ or only $Nd^{3+}$. A property of the phosphor whose luminescence center is only $Nd^{3+}$ is explained referring an excitation spectrum of FIG. 3(a) and an emission spectrum of FIG. 3(b). FIG. 3 shows graphs of the excitation spectrum and the emission spectrum of $Nd_2O_3$ doped $Bi_2O_3$—$B_2O_3$ based glass. Concretely, this phosphor 5 is made of $Nd_2O_3$ 1.0 mol %, $Bi_2O_3$ 49.0 mol %, $B_2O_3$ 49.0 mol % and $Sb_2O_3$ 1.0 mol %. The excitation spectrum is obtained from an emission intensity measured at 1070 nm of emitting wavelength and the emission spectrum is obtained from an emission intensity measured at 530 nm of exciting wavelength.

As shown in FIG. 3(a), this phosphor can be excited from 450 nm to 800 nm. Thus, the LED element 4 can excite the phosphor 5 if it emits light of wavelength range from 450 nm to 800 nm. As shown in FIG. 3(a), in the excitation spectrum, peaks similar to $Yb^{3+}$ and $Nd^{3+}$ co-doped glass are observed. As shown in FIG. 3(b), this phosphor has peaks at around 930 nm and at around 1070 nm.

In FIG. 2(b) of the above embodiment, although the phosphor which has the sharp emission peak at 974 nm, it is possible to suppress this peak by using the property of $Yb^{3+}$ which has a peak of the excitation (absorption) spectrum. FIG. 4 is graphs which show an absorption spectrum and an emission spectrum of the phosphor made of $Yb_2O_3$ 1.0 mol %, $Bi_2O_3$ 49.0 mol %, $B_2O_3$ 49.0 mol % and $Sb_2O_3$ 1.0 mol %. As shown in FIG. 4, the emission and the absorption are overlapped at around 975 nm. In case of a constant concentration of $Nd_2O_3$ this emission peak can be suppressed if a concentration of $Yb_2O_3$ is increased. Then, the excitation efficiency can be very high by reabsorbing light caused by the emission of $Yb^{3+}$ at around 975 nm. Thus, if the phosphor 5 contains richer $Yb^{3+}$ or the distance to the outer surface of the phosphor 5 from the LED element 4 is longer, the emission peak can be suppressed and the excitation efficiency can be high.

A suppressive action of the emission peak at around 975 nm is also confirmed by comparing emission spectrums of three phosphors shown in FIG. 5 to FIG. 7. Note that these phosphors may be the phosphor 5 in the above embodiment. FIG. 5 is a graph which shows an emission spectrum of the phosphor made of $Yb_2O_3$ 2.0 mol %, $Nd_2O_3$ 5.0 mol %, $Bi_2O_3$ 46.0 mol %, $B_2O_3$ 46.0 mol % and $Sb_2O_3$ 1.0 mol %. FIG. 6 is a graph which shows an emission spectrum of the phosphor made of $Yb_2O_3$ 3.0 mol %, $Nd_2O_3$ 5.0 mol %, $Bi_2O_3$ 45.5 mol %, $B_2O_3$ 45.5 mol % and $Sb_2O_3$ 1.0 mol %. FIG. 7 is a graph which shows an emission spectrum of the phosphor made of $Yb_2O_3$ 4.0 mol %. $Nd_2O_3$ 5.0 mol %, $Bi_2O_3$ 45.0 mol %, $B_2O_3$ 45.0 mol % and $Sb_2O_3$ 1.0 mol %. The emission spectrums in FIG. 5 to FIG. 7 are measured by using an excitation light source of 530 nm.

As shown in FIG. 5 to FIG. 7, in case of a constant concentration of $Nd_2O_3$, it is understood that an intensity of the emission peak at around 975 nm is reduced if a concentration of $Yb_2O_3$ is increased. As shown in FIG. 5 to FIG. 7, all the emission peaks at longer side of the emission peak of around 975 nm are 1003 nm-1005 nm and the full width at half maximum of the emission peaks are 81 nm-83 nm. Thus, increasing a concentration of $Yb_2O_3$ is effective in suppressing only the sharp emission without highly influencing to the peak emission wavelength and the full width at half maximum.

Furthermore, the phosphors having the spectrums shown in FIG. 8 and FIG. 9 can be used instead of each phosphor shown the spectrums in FIG. 2 to FIG. 7. FIG. 8 is a graph which shows an emission spectrum of the phosphor made of $Yb_2O_3$ 5.1 mol %, $Bi_2O_3$ 47.5 mol % and $B_2O_3$ 47.4 mol %. The emission spectrum in FIG. 8 is measured by using an excitation light source of 488 nm. When making the phosphor, because of mixing $Yb_2O_3$ powder, $Bi_2O_3$ powder and $H_3BO_3$ powder and melting it at 1000° C. of relatively low temperature, a reduction action of $Bi^{3+}$ does not occur. As shown in FIG. 8, according to this phosphor, the emission spectrum which is Gaussian-like shape and has the peak emission wavelength of 1026 nm and the full width at half maximum of 72 nm is obtained. Note that similar spectrums are obtained by the phosphor whose $Yb_2O_3$ powder is 6.1 mol % or 6.9 mol %.

FIG. 9 is a graph which shows an emission spectrum of the phosphor made of $Yb_2O_3$ 5.0 mol % $Bi_2O_3$ 44.4 mol % and $B_2O_3$ 48.6 mol %. The emission spectrum in FIG. 9 is measured by using an excitation light source of 488 nm. As shown in FIG. 9, according to this phosphor, the emission spectrum which is Gaussian-like shape and has the peak emission wavelength of 1026 nm and the full width at half maximum of 84 nm is obtained.

Note that similar spectrums are also obtained by the phosphor made of $Yb_2O_3$ 5.0 mol %, $Nd_2O_3$ 2.9 mol %, $Bi_2O_3$ 43.9 mol % and $B_2O_3$ 48.1 mol %, and similar spectrums are also obtained by the phosphors whose $Bi_2O_3$ and $Bi_2O_3$ are changed to 91.9 mol % and 0 mol %, 82.4 mol % and 9.5 mol %, 73.2 mol % and 18.8 mol %, 64.5 mol % and 27.3 mol %, 55.2 mol % and 33.7 mol %, 36.6 mol % and 55.4 mol % pegging $Yb_2O_3$ and $Nd_2O_3$ at 5.0 mol % and 3.0 mol %.

Furthermore, for example, rare-earth ion of Tm ion, Er ion, Dy ion, Pr ion etc. can be used as the luminescence center of the phosphor 5 of the above embodiment instead of Yb ion and Nd ion. The wavelengths of representative rare-earth ions are shown in FIG. 10. As shown in FIG. 10, because each rare-earth ion has different emission wavelength, rare-earth ions should be selected in accordance with the use of the semiconductor light-emitting device 1.

Furthermore, a concentration of rare-earth ions may be changed at a near side of the LED element 4 in the phosphor 5 (for example, the lower side in FIG. 1) and at a far side of the LED element 4 (for example, the upper side in FIG. 1). This is an intentional concentration changing and different from an unintended dispersion unevenness of the conventional technology. In this case, the phosphor 5 can be composed of plural layers from the side of the LED element 4, whose concentration of rare-earth ions is different, and can be continuously changed as the distance from the LED element 4 is far. Furthermore, the kind of rare-earth ions may be changed in the phosphor 5.

Also, although $Bi_2O_3$—$B_2O_3$ based glass is shown as the luminescence center of the phosphor 5 of the above embodiment, phosphoric acid based glass or fluoride glass may be used. Concretely, low melting point glasses such as $Bi_2O_3$—$GeO_2$ based glass, $ZnO$—$B_2O_3$ based glass, $CaO$—$B_2O_3$ based glass, $CaO$—$P_2O_5$ based glass etc. can be listed. In the glass of the matrix of the phosphor 5, lower melting point is preferable because of sealing the LED element 4. It is also preferable that the refractive index of the matrix glass of the phosphor 5 is adjusted to the refractive index of the substrate 41 of the LED element 4. For example, in the above embodiment, using the glass of refractive index 1.8 as the matrix of the phosphor 5 is preferable because the substrate 41 is a sapphire of refractive index 1.8. Note that the refractive index of the glass can be changed by adjusting the amount of each oxide in the glass.

Furthermore, a composition of the matrix glass may be changed at a near side of the LED element 4 in the phosphor 5 (for example, the lower side in FIG. 1) and at a far side of the LED element 4 (for example, the upper side in FIG. 1). For example, if the melting point of the glass is relatively lower at the near side of the LED element 4 and is relatively higher at the far side of the LED element 4, thermal load for the LED element 4 can be reduced when sealing the LED element 4, and only the near side glass is melted and the LED element 4 can be sealed using the far side glass as a mold after the far side glass is molded to the predetermined shape. Also, for example, if the refractive index of the glass is relatively higher at the near side of the LED element 4 and is relatively lower at the far side of the LED element 4, light from the LED element 4 can be radiated to outside without total reflecting at the LED element 4 and at the phosphor 5. On the other hand, for example, if the refractive index of the glass is relatively lower at the near side of the LED element 4 and is relatively higher at the far side of the LED element 4, light can be total reflected in the phosphor 5 and can be radiated to outside after converting wavelength of light well.

Furthermore, considering the intensity distribution of the LED element 4, it is possible to change rare-earth ion concentration or composition of the matrix glass accordingly such that the desirable intensity distribution is achieved in the semiconductor light-emitting device 1. For example, in case that the intensity distribution of the LED element 4 is asymmetry on the center axis of the element (the axis which is perpendicular to the output surface of the element and is passing through the center of the element), the rare-earth ion concentration or the reflective index of the phosphor 5 can be designed such that light from the semiconductor light-emitting device 1 is symmetry on the center axis of the device. Also, in case that the intensity distribution of the LED element 4 is symmetry on the center axis of the element, the rare-earth ion concentration or the reflective index of the phosphor 5 can be designed such that light from the semiconductor light-emitting device 1 is asymmetry on the center axis of the device.

Although the lenticular surface 51 of the phosphor 5 is a smooth curvature shape, for example shown in FIG. 11, the lenticular surface 51 can be a Fresnel lens shape whose distance from the LED element 4 is constant and the lenticular surface 51 can be changed arbitrarily. In the semiconductor light-emitting device 1 shown in FIG. 11, because the light path length in the phosphor 5 is constant, the color unevenness of light from the device can be further reduced.

FIG. 12 shows a second embodiment of this invention and FIG. 12 is a typical cross-sectional drawing of a semiconductor light-emitting device. As shown in FIG. 12, this semiconductor light-emitting device 101 comprises a pair of lead frames 102,103, an LED element 104 mounted on one lead frame 102 and a phosphor 5 sealing the LED element 104 as a sealing material.

Each lead frame 102,103 has a rod-like part 121,131 which extends in a predetermined direction and is arranged parallel to one another. One lead frame 102 has a mounting part 122 which is formed at the top side of the rod-like part 121 and mount the LED element 4, and a reflecting part 123 which is formed to upside from the outer edge of the mounting part 122 and surround the LED element 104.

The mounting part 122 extends in direction approaching to other lead frame 103 from the top side of the rod-like part 121 and is arranged at intervals between one lead frame 102 and other lead frame 103 for ensuring the insulation. An upper surface of the mounting part 122 is formed smoothly and has a circular form. The reflecting part 123 reflects light from the LED element 104 to upside and its inner surface is formed such that it spleads against upside from downside.

In the LED element 104, a semiconductor layer 142 is formed on a substrate 141 and an electrode 143 formed on the semiconductor layer 142 is connected electrically to other lead frame 103 by a wire 145. The substrate 141 of the LED element 104 has conductive and is connected electrically to one lead frame by contacting the mounting part 122.

In this embodiment, the substrate 141 consists of an Al and N doped 6H type single-crystal SiC and the semiconductor layer 142 consists of a semiconductor expressed in a formula $In_xAl_yGa_{1-x-y}N$ ($0 \leq x \leq 1, 0 \leq y \leq 1, 0 \leq x+y \leq 1$). The semiconductor layer 142 emits ultraviolet light which is less than or equal to 408 nm and the substrate 141 emits white light similar to sun light at 450 nm-750 nm by the donor-acceptor-pair-emission of the pair of B and N, and Al and N when excited by ultraviolet light.

Inside of the mounting part 122 of the lead frame 102 and the reflecting part 123 is filled with the phosphor 5 sealing the LED element 104 and its outer surface is a lenticular surface 51. In this embodiment, the phosphor 5 is flush with the outer side of the lead frames 102,103. The matrix of the phosphor 5 is $Bi_2O_3$—$B_2O_3$ based glass and the luminescence center of the phosphor 5 is Yb ion and Nd ion. The phosphor 5 emits infrared light of 850 nm-1100 nm when excited by light from the LED element 104. In case of molding the phosphor 5, it is preferable that the viscosity of the phosphor 5 is decreased enough such that the damages to the wire 145 is reduced.

In the semiconductor light-emitting device 101 as consisted above, the LED element 104 emits white light which is wavelength of 450 nm-750 nm when the voltage is impressed to each lead frame 102,103. The phosphor 5 emits infrared light which has a peak wavelength of 1000 nm and a full width at half maximum of 80 nm when excited by white light from the LED element 104. As mentioned above, because the glass containing $Yb^{3+}$ and $Nd^{3+}$ has plural excitation bands, the emission intensity of the phosphor 5 can be high by white light from the LED element 104.

In each embodiment above, although the semiconductor light-emitting device which has the phosphor placed at the top side of a pair of lead frames having the rod-like portion, for example, as shown in FIG. 13 and FIG. 14, the semiconductor light-emitting device can be surface-mounted type and the structure of the device can be changed arbitrarily.

The semiconductor light-emitting device 201 shown in FIG. 13 has a concave part which is opened against upside and is formed on a base body 206 consisting of a ceramic, and the LED element 4 is flip-chip mounted on the inside of this concave part. Metal patterns 202,203 consisting of metal for an electrical power supply are formed on a bottom part 262 of the base body 206. The base body 206 has a reflecting part 261 surrounding the LED element 4. The inside of the concave part of the base body 206 is filled with the phosphor 5. The LED element 4 and the phosphor 5 are the same of the first embodiment. An upper surface of the phosphor 5 is formed smoothly such that it is flush with the reflecting part 261. The inside of the concave part of the base body 206 is filled with the phosphor 5 which was melted.

The semiconductor light-emitting device 301 shown in FIG. 14 mounts the LED element 104 on the inside of the concave part of the base body 206. The LED element 104 is same of the second embodiment. An electrode 143 of the LED element 104 and the metal pattern 203 are connected electrically by a wire 345. The inside of the concave part of the base body 206 is filled with the phosphor 5. The phosphor 5 is the same of the first embodiment. The inside of the concave part of the base body 206 is filled with the phosphor 5 which was melted.

In each embodiments above, although the phosphor 5 emitting infrared light is shown, the phosphor 5 emitting visible light such as yellow light, red light etc. may be used. For example, yellow light is emitted if the luminescence center of the phosphor is Ce ion and red light is emitted if Eu ion. In case that the phosphor emits light at visible region, it is preferable that the matrix glass whose absorption at visible region is relatively small is selected. $ZnO$—$B_2O_3$ based glass can be listed such as this glass.

Also, in each embodiment above, although the LED element is shown as the semiconductor light-emitting element, for example, other semiconductor light-emitting device such as an LD element can be used. Also, although InAlGaN system material is shown as the semiconductor layer of the semiconductor light-emitting element, for example, other semiconductor material such as AlGaAs system material, GaAsP system material etc. can be used, and other concrete detail structures can be changed arbitrarily.

REFERENCE SIGNS LIST

Figure 1:
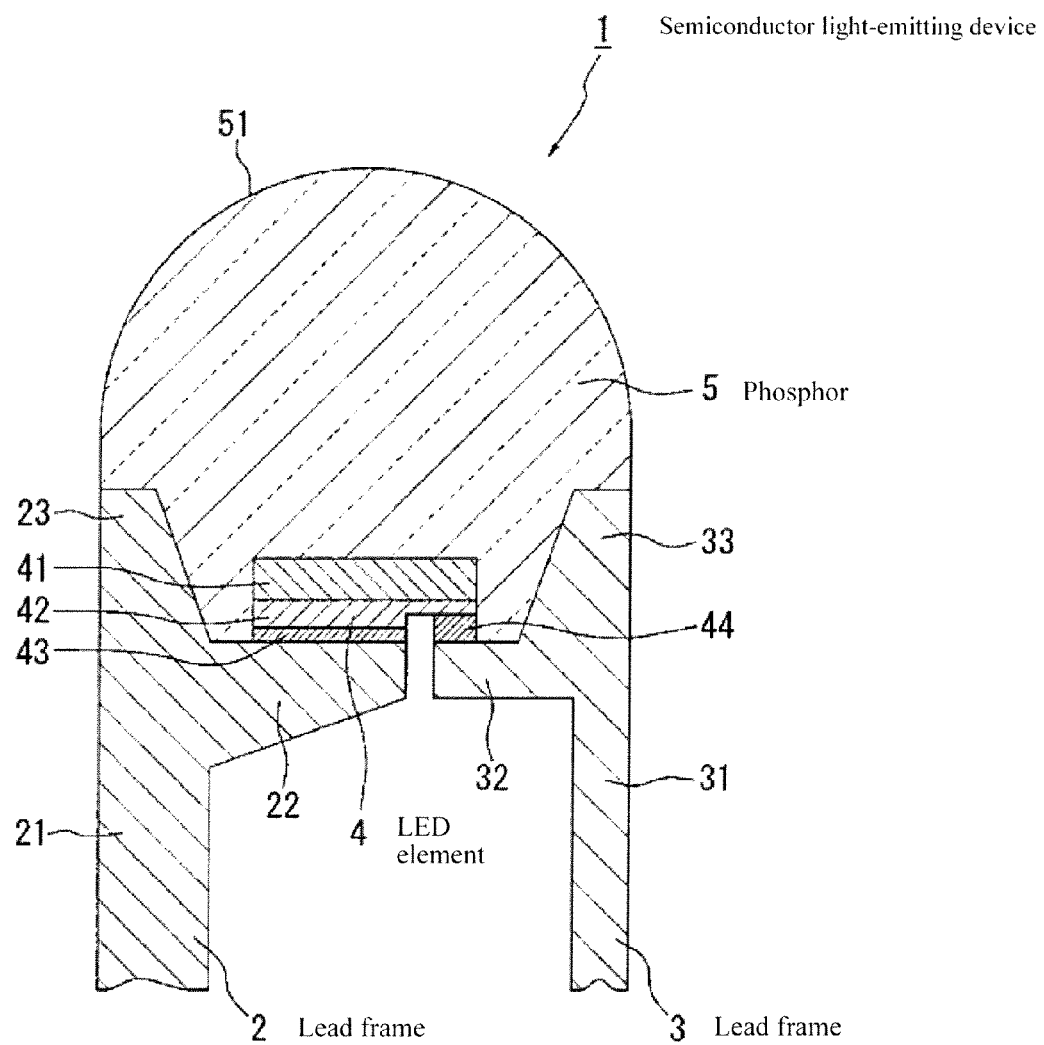
FIG. 1 is a typical cross-sectional drawing of a semiconductor light-emitting device of a first embodiment of this invention.
Figure 2:
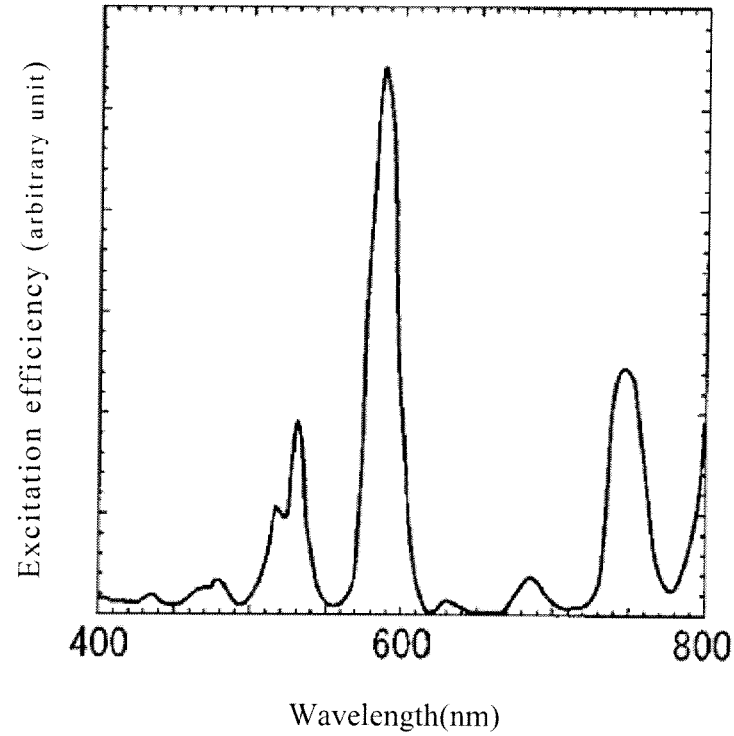
FIG. 2 shows a property of a phosphor, and (a) shows a graph of an excitation spectrum and (b) shows a graph of an emission spectrum.
Figure 2:
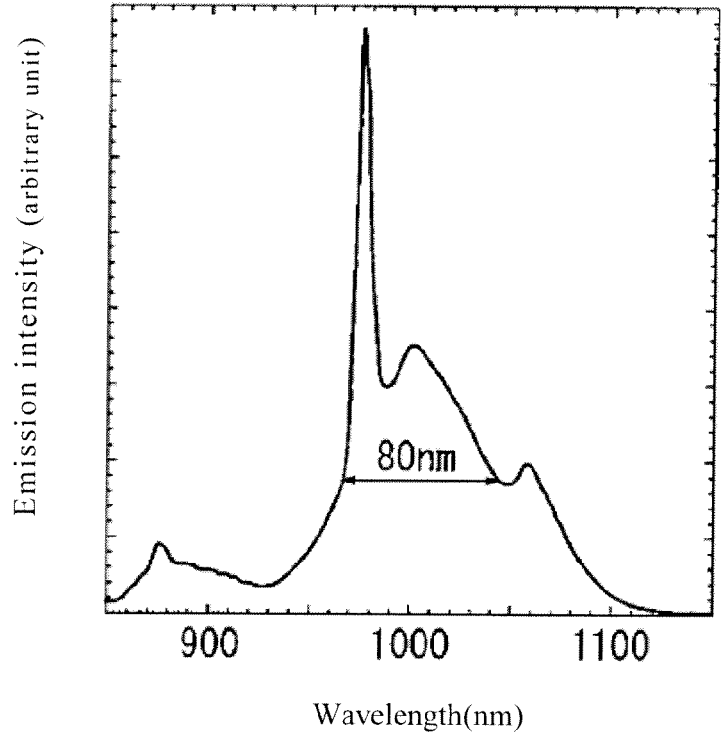
Figure 3:
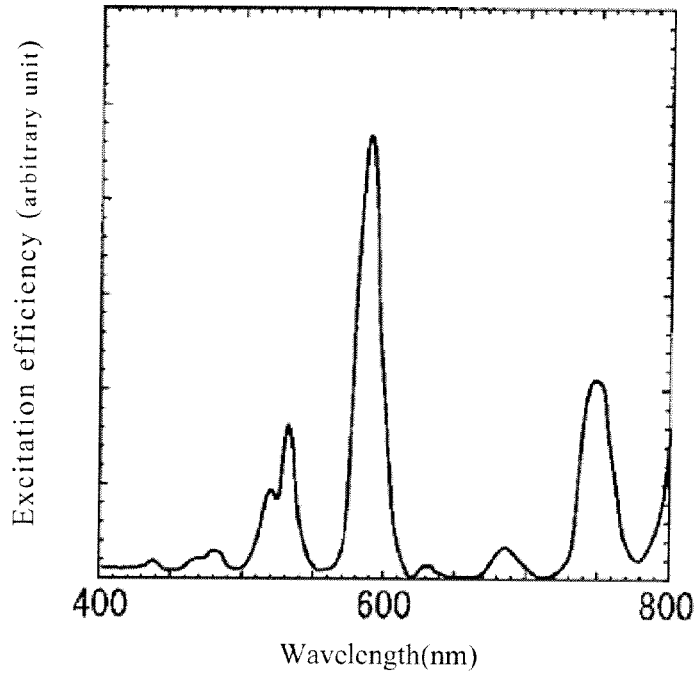
FIG. 3 shows a property of a phosphor of other embodiment, and (a) shows a graph of an excitation spectrum and (b) shows a graph of an emission spectrum.
Figure 3:
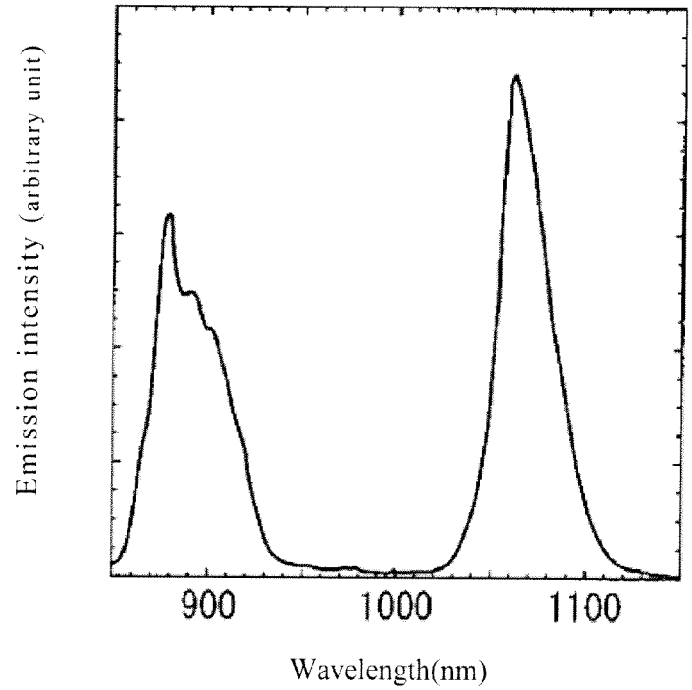
Figure 4:
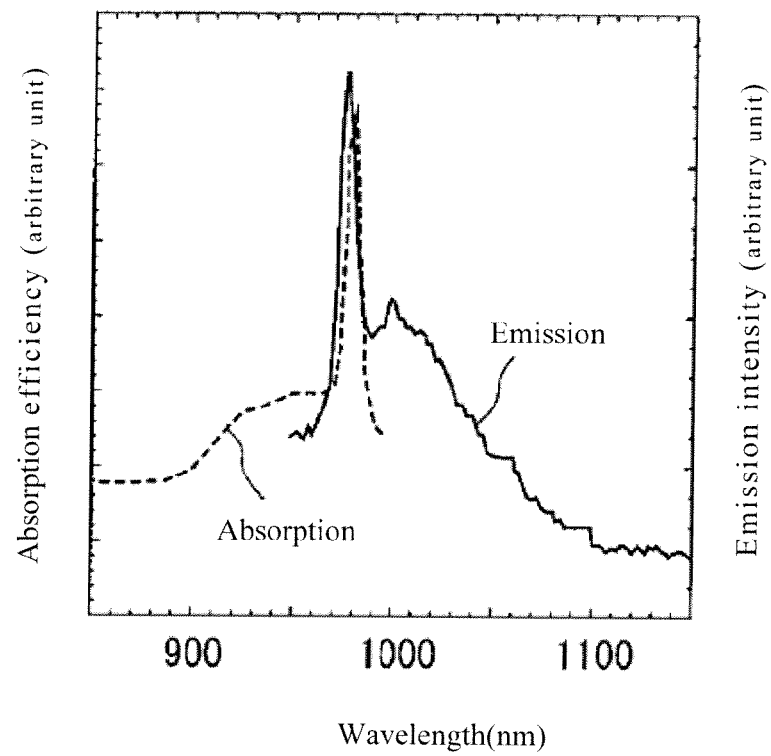
FIG. 4 shows graphs of an absorption spectrum and an emission spectrum in other embodiment.
Figure 5:
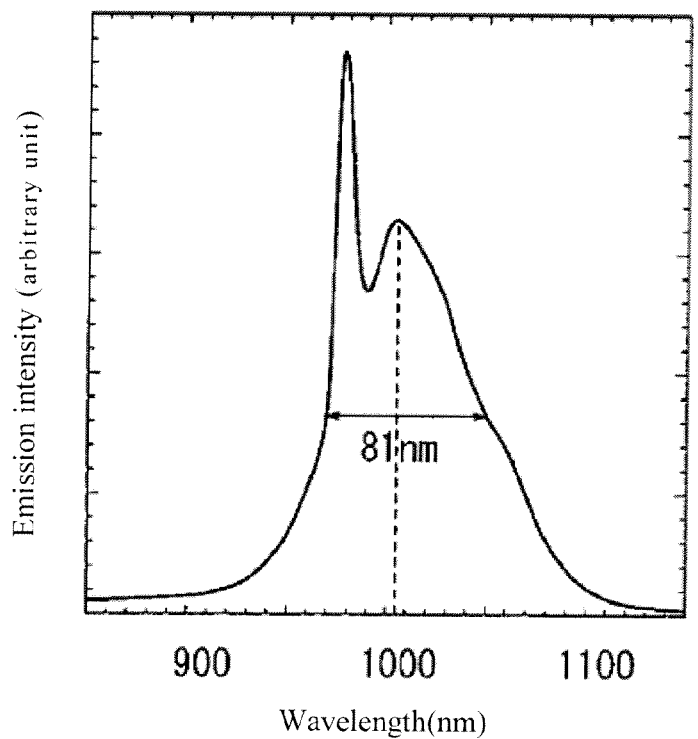
FIG. 5 shows a graph of an emission spectrum in other embodiment.
Figure 6:
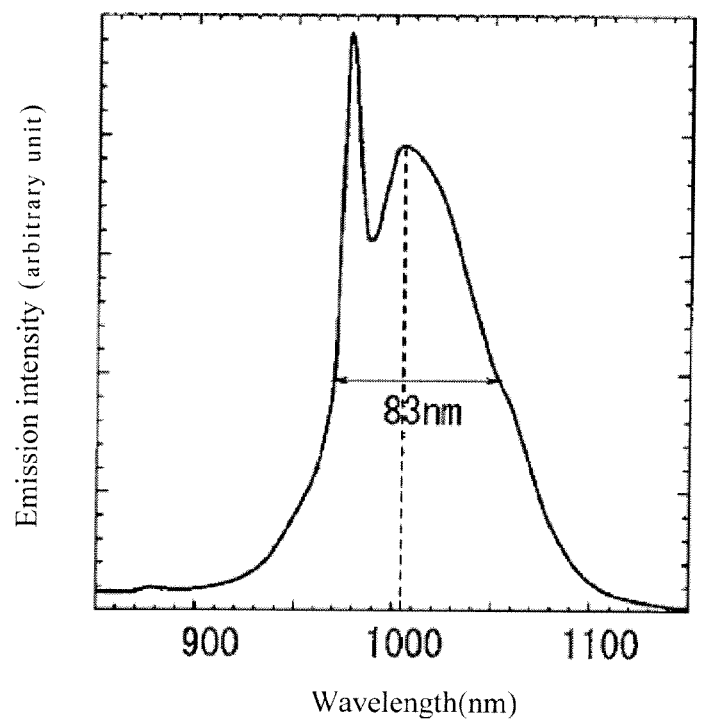
FIG. 6 shows a graph of an emission spectrum in other embodiment.
Figure 7:
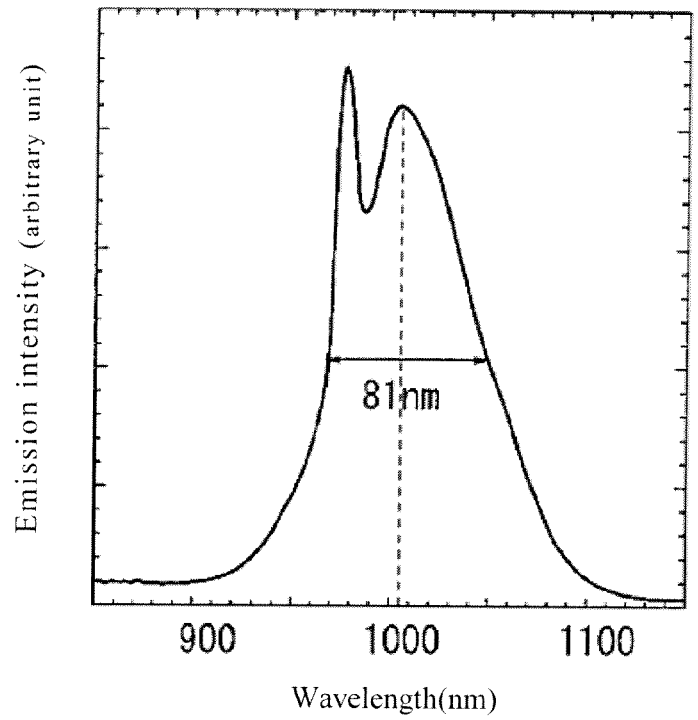
FIG. 7 shows a graph of an emission spectrum in other embodiment.
Figure 8:
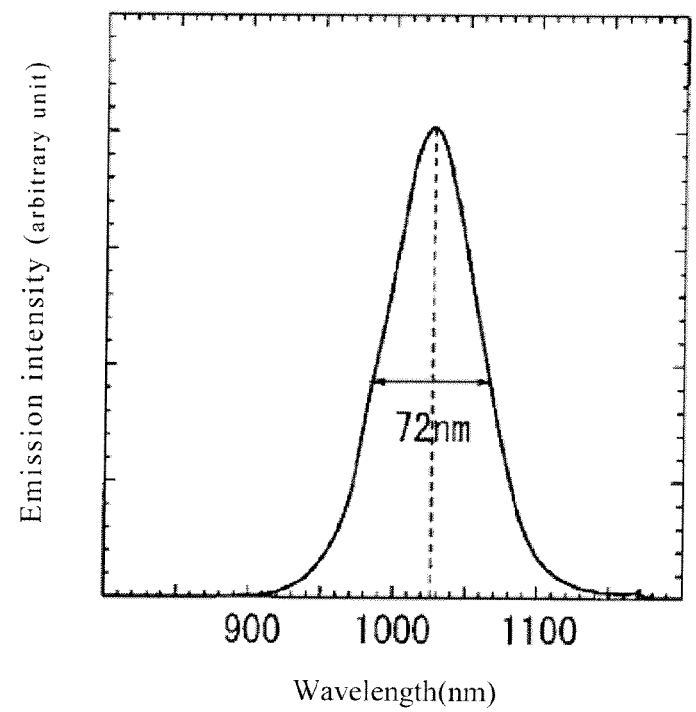
FIG. 8 shows a graph of an emission spectrum in other embodiment.
Figure 9:
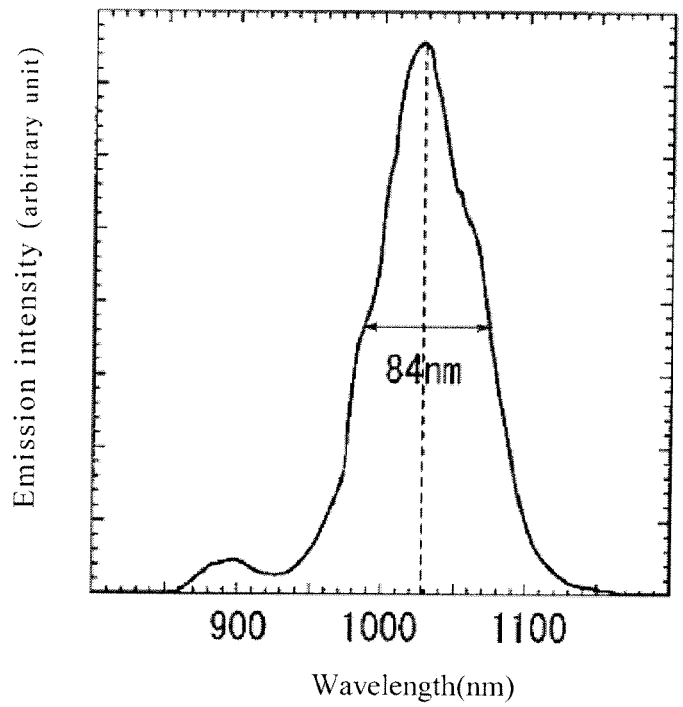
FIG. 9 shows a graph of an emission spectrum in other embodiment.
Figure 10:
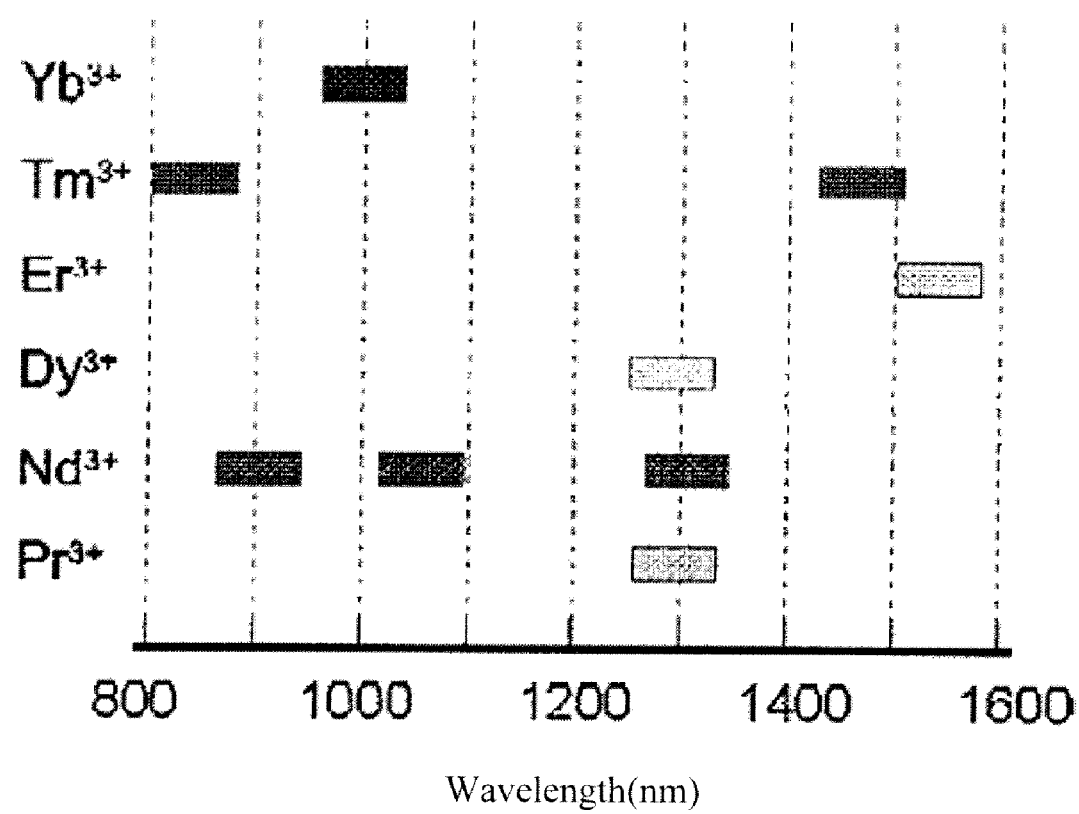
FIG. 10 shows wavelengths of representative rare-earth ions.
Figure 11:
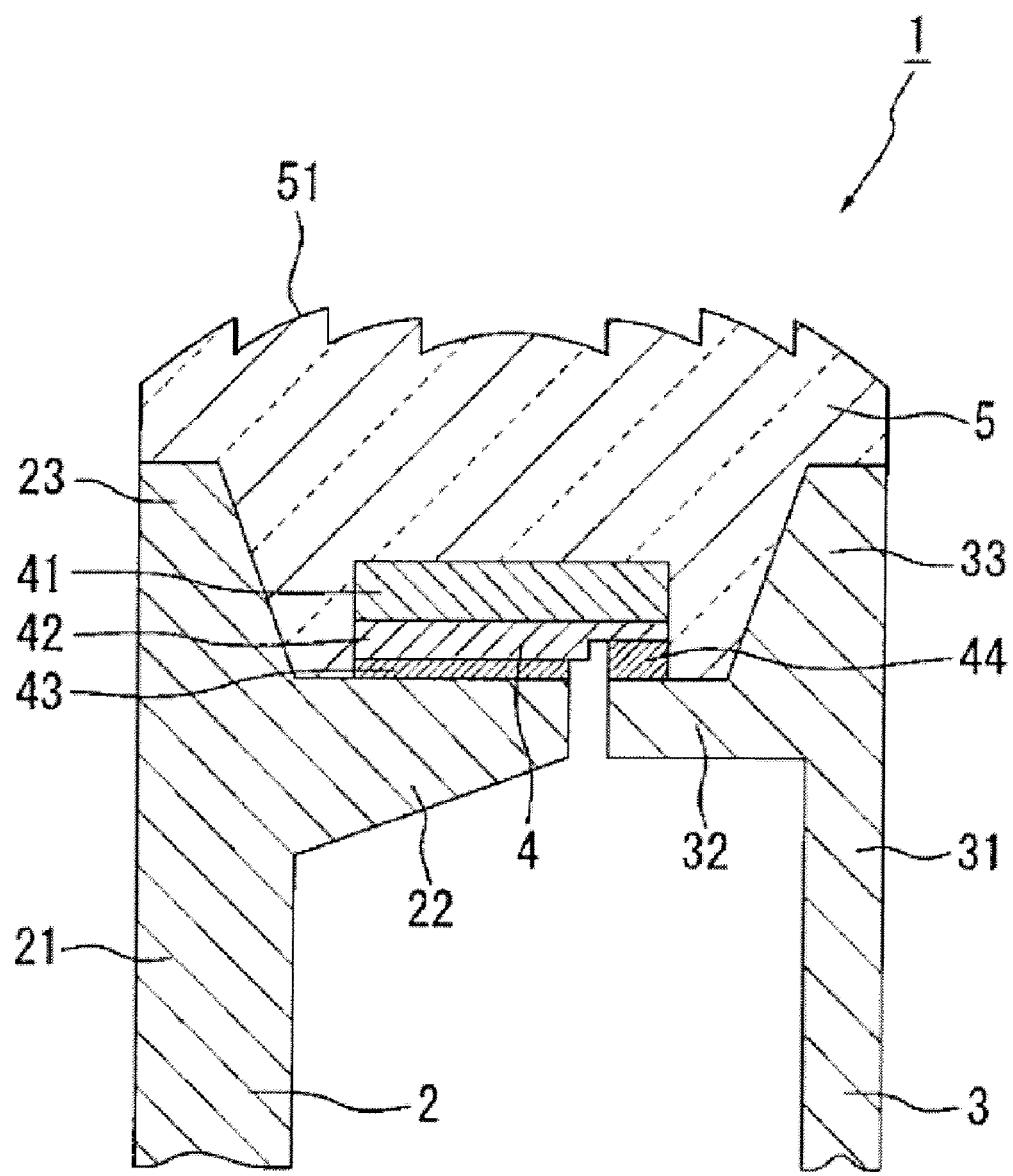
FIG. 11 is a typical cross-sectional drawing of a semiconductor light-emitting device of other embodiment.
Figure 12:
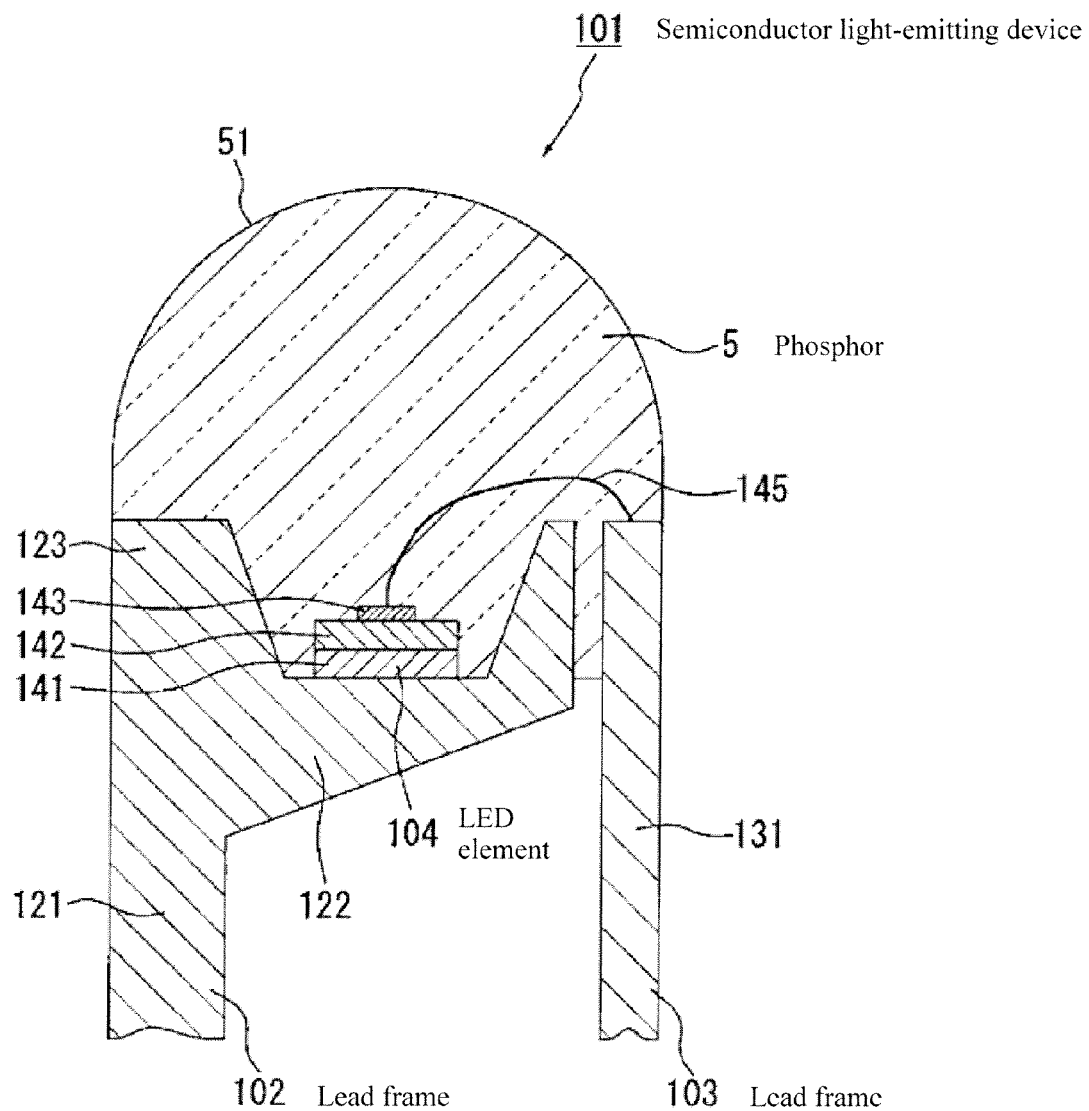
FIG. 12 is a typical cross-sectional drawing of a semiconductor light-emitting device of a second embodiment of this invention.
Figure 13:
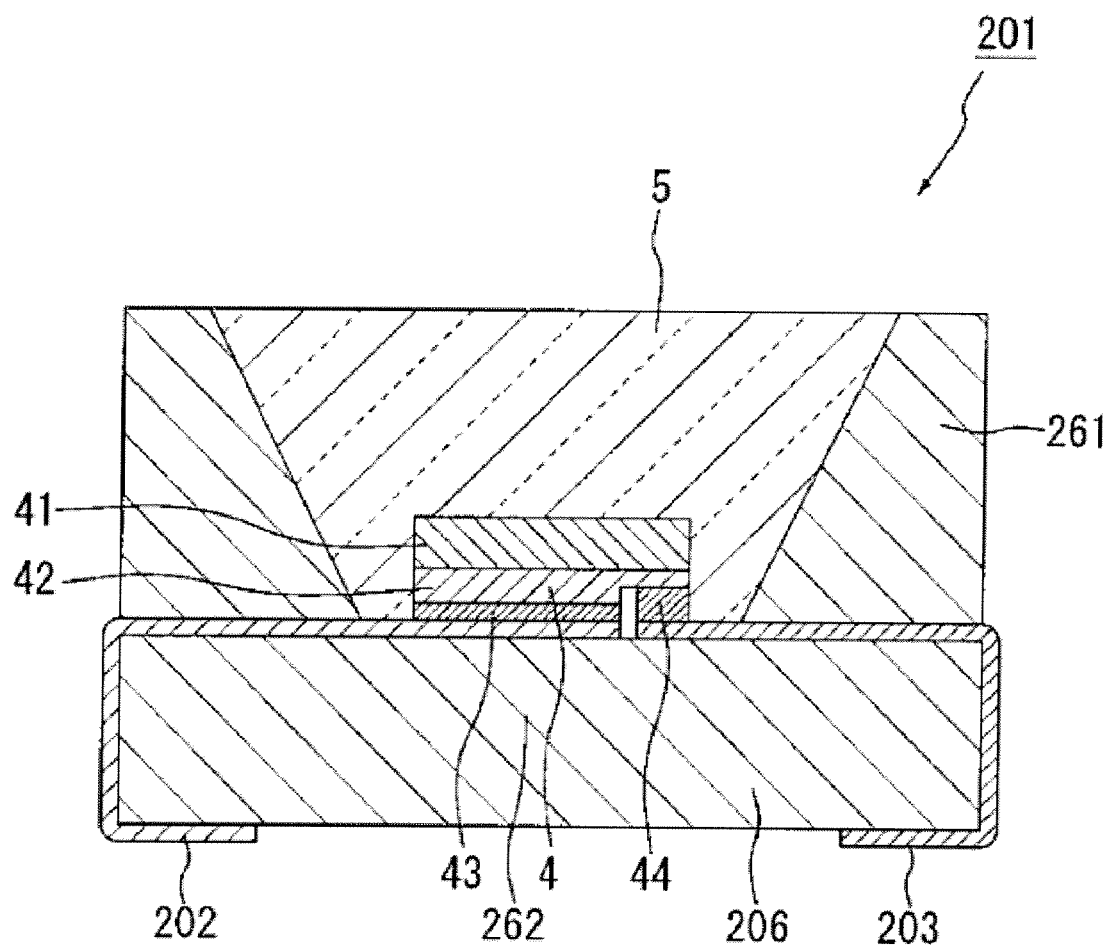
FIG. 13 is a typical cross-sectional drawing of a semiconductor light-emitting device of other embodiment.
Figure 14:
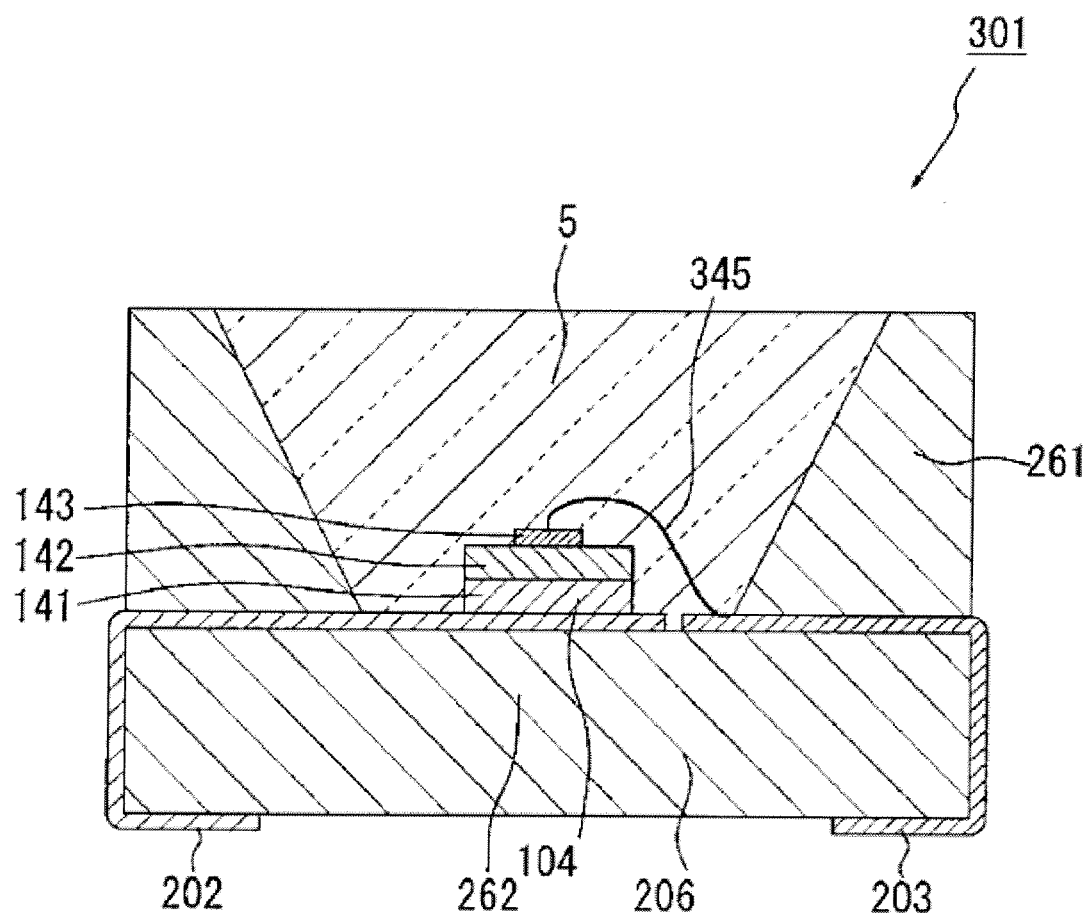
FIG. 14 is a typical cross-sectional drawing of a semiconductor light-emitting device of other embodiment.

1 Semiconductor light-emitting device
2 Lead frame
3 Lead frame
4 LED element
5 Phosphor
21 Rod-like part
22 Mounting part
23 Reflecting part
31 Rod-like part
32 Mounting part
33 Reflecting part
41 Substrate
42 Semiconductor layer
43 P-electrode
44 N-electrode
51 Lenticular surface
101 Semiconductor light-emitting device
102 Lead frame
103 Lead frame
104 LED element
121 Rod-like part
122 Mounting part
123 Reflecting part
141 Substrate
142 Semiconductor layer
143 P-electrode
145 Wire
201 Semiconductor light-emitting device
202 Metal pattern
203 Metal pattern
206 Base body
261 Reflecting part
262 Bottom part
301 Semiconductor light-emitting device
345 Wire

The invention claimed is:

1. A semiconductor light-emitting device, comprising:
a semiconductor light-emitting element; and
a sealing material directly sealing the semiconductor light-emitting element, the sealing material consisting of a phosphor which comprises a matrix comprising a glass and a luminescence center included in the matrix,
wherein the matrix comprising the glass has different refractive indices in a near side and in a far side of the semiconductor light-emitting element, the far side being located farther from the semiconductor light-emitting element than the near side,
wherein the matrix comprising the glass has a higher refractive index at the far side than at the near side of the semiconductor light-emitting element, and
wherein the refractive index of the matrix comprising the glass is the same as a refractive index of the semiconductor light-emitting element in the semiconductor light-emitting element and the phosphor sealing the semiconductor light-emitting element.

2. The semiconductor light-emitting device according to claim 1, wherein the semiconductor light-emitting element emits white light.

3. The semiconductor light-emitting device according to claim 1, wherein the luminescence center of the phosphor comprises at least one of Yb ion and Nd ion.

4. The semiconductor light-emitting device according to claim 3, wherein the luminescence center of the phosphor comprises Yb ion and Nd ion, and the phosphor emits at around 850-1100 nm when excited by the semiconductor light-emitting element.

5. The semiconductor light-emitting device according to claim 4, wherein a spectrum of the phosphor has plural peaks at from 450 nm to 800 nm.

6. The semiconductor light-emitting device according to claim 5, wherein the semiconductor light-emitting element emits light of wavelength range from 450 nm to 800 nm.

7. The semiconductor light-emitting device according to claim 6, wherein the phosphor has a most excellent excitation efficiency at around 585 nm, and the semiconductor light-emitting element emits light which has a peak wavelength at 585 nm.

8. The semiconductor light-emitting device according to claim 1, wherein the phosphor emits infrared light when excited by light from the semiconductor light-emitting element.

9. The semiconductor light-emitting device according to claim 1, wherein the matrix of the phosphor comprises a $Bi_2O_3$—$B_2O_3$ based glass.

10. The semiconductor light-emitting device according to claim 1, wherein the matrix of the phosphor comprises $Sb_2O_3$.

11. The semiconductor light-emitting device according to claim 1, wherein the phosphor comprises a $Bi_2O_3$—$B_2O_3$ based glass.

12. The semiconductor light-emitting device according to claim 1, wherein the phosphor comprises one of a ZnO—$B_2O_3$ based glass, a CaO—$B_2O_3$ based glass, and a CaO—$P_2O_5$ based glass.

13. The semiconductor light-emitting device according to claim 1, wherein, throughout the phosphor, an amount of oxides in the glass is changed such that the refractive index of the matrix comprising the glass varies in the phosphor.

14. The semiconductor light-emitting device according to claim 1, wherein, in the matrix, the far side of the semiconductor light-emitting element has a concentration of rare-earth ions different from a concentration of the rare-earth ions in the near side of the semiconductor light-emitting element.

15. The semiconductor light-emitting device according to claim 1, wherein the phosphor seals an entirety of the exposed surfaces of the semiconductor light-emitting element.

16. A semiconductor light-emitting device, comprising:
a semiconductor light-emitting element; and
a sealing material sealing the semiconductor light-emitting element, the sealing material comprising a phosphor which includes a matrix comprising a glass and a luminescence center included in the matrix,
wherein a refractive index of the matrix in a far side of the matrix is more than the refractive index of the matrix in a near side of the matrix, the far side being located farther from the semiconductor light-emitting element than the near side, and
wherein the refractive index of the matrix is the same as a refractive index of the semiconductor light-emitting element.

17. The semiconductor light-emitting device according to claim 16, wherein the sealing material consists of the phosphor.

18. The semiconductor light-emitting device according to claim 16, wherein the phosphor comprises a $Bi_2O_3$—$B_2O_3$ based glass.

19. The semiconductor light-emitting device according to claim 16, wherein the matrix of the phosphor comprises a $Bi_2O_3$—$B_2O_3$ based glass.

20. The semiconductor light-emitting device according to claim 1, wherein the phosphor comprises one of a ZnO—$B_2O_3$ based glass, a CaO—$B_2O_3$ based glass, and a CaO—$P_2O_5$ based glass.

* * * * *